(12) United States Patent
Wu et al.

(10) Patent No.: US 9,935,006 B2
(45) Date of Patent: *Apr. 3, 2018

(54) TRENCH LINER FOR REMOVING IMPURITIES IN A NON-COPPER TRENCH

(71) Applicant: Taiwan Semiconductor Manufacturing Company, Ltd., Hsin-Chu (TW)

(72) Inventors: Hsien-Chang Wu, Taichung (TW); Li-Lin Su, Taichung County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/447,251

(22) Filed: Mar. 2, 2017

(65) Prior Publication Data

US 2017/0178957 A1    Jun. 22, 2017

Related U.S. Application Data

(63) Continuation of application No. 14/828,585, filed on Aug. 18, 2015, now Pat. No. 9,589,897.

(51) Int. Cl.
*H01L 21/768* (2006.01)
*H01L 23/522* (2006.01)
*H01L 23/532* (2006.01)

(52) U.S. Cl.
CPC .... *H01L 21/76882* (2013.01); *H01L 21/7684* (2013.01); *H01L 21/76802* (2013.01); *H01L 21/76843* (2013.01); *H01L 21/76873* (2013.01); *H01L 21/76876* (2013.01); *H01L 21/76879* (2013.01); *H01L 23/5226* (2013.01); *H01L 23/53209* (2013.01); *H01L 23/53252* (2013.01)

(58) Field of Classification Search
CPC ................ H01L 23/53266; H01L 21/76807
USPC .................................. 257/751; 438/626, 627
See application file for complete search history.

(56) References Cited

U.S. PATENT DOCUMENTS

| | | | |
|---|---|---|---|
| 7,172,967 B2 | 2/2007 | Kim et al. | |
| 2009/0053426 A1* | 2/2009 | Lu ........................... | C23C 16/16 427/540 |
| 2009/0233439 A1 | 9/2009 | Park et al. | |
| 2013/0341620 A1 | 12/2013 | Birner et al. | |
| 2014/0264867 A1 | 9/2014 | Kuo et al. | |
| 2015/0093891 A1 | 4/2015 | Zope et al. | |
| 2015/0270211 A1 | 9/2015 | Kobrinsky et al. | |
| 2015/0307430 A1 | 10/2015 | Miller et al. | |

* cited by examiner

*Primary Examiner* — Cuong Q Nguyen
*Assistant Examiner* — Tong-Ho Kim
(74) *Attorney, Agent, or Firm* — Haynes and Boone, LLP (57) ABSTRACT

The present disclosure involves a method of fabricating a semiconductor device in a semiconductor technology node that is 5-nanometer or smaller. An opening is formed that extends through a plurality of layers over a substrate. A barrier layer is formed on surfaces of the opening. A liner layer is formed over the barrier layer in the opening. The barrier layer and the liner layer have different material compositions. The opening is filled with a non-copper metal material. The non-copper material is formed over the liner layer. In some embodiments, the non-copper metal material includes cobalt.

20 Claims, 8 Drawing Sheets

TRENCH LINER FOR REMOVING IMPURITIES IN A NON-COPPER TRENCH

PRIORITY

The present application is a continuation application of U.S. patent application Ser. No. 14/828,585, filed Aug. 18, 2015, entitled "TRENCH LINER FOR REMOVING IMPURITIES IN A NON-COPPER TRENCH", now U.S. Pat. No. 9,589,897, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, conductive elements may be formed to provide electrical interconnections for the various components for an IC. Typically, these conductive elements are formed by etching trenches+via or openings in various layers and filling these trenches+via with a conductive material. However, as semiconductor fabrication technology nodes continue to evolve, the critical dimension is becoming so small that filling trench+via with the conductive material may not be easy. Often times, issues such as voids or overhang may arise during the filling of the trenches+via. These issues may degrade the performance of the semiconductor device and may even lead to device failures.

Therefore, while conventional filling techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As a part of semiconductor fabrication, electrical interconnections need to be formed to electrically interconnect the various microelectronic elements (e.g., source/drain, gate, etc.) of the semiconductor device. Generally, this involves forming trenches in layers (such as in electrically insulating layers), and subsequently filling these trenches with an electrically conductive material. The electrically conductive material is then polished to form the electrical interconnections such as metal lines or vias.

However, as semiconductor technology generations continue the scaling-down process, the trench filling process discussed above may become problematic due to the ever-decreasing trench sizes. For example, whereas copper is a fine candidate material for filling the trenches (to form the metal lines and/or vias) in older semiconductor technology nodes (e.g., 10-nanometer or above), its performance may be inadequate for newer technology nodes (e.g., 5-nanometer technology node or below). For example, thin and conformal deposition of a copper seed in the trenches may be difficult to achieve for a 5-nanometer technology node or below. Electromigration may also become a concern. Consequently, semiconductor devices fabricated under newer technology nodes (e.g., 5-nanometer and below) may suffer from various gap-filling issues if conventional metal filling techniques (such as copper filling) are still used. The gap-filling issues may compromise the performance of the semiconductor device or even lead to device failures.

To overcome the gap-filling issues discussed above, the present disclosure proposes a novel method and structure for filling the trenches with a non-copper material for newer semiconductor technology nodes, such as for the 5-nanometer technology node or below. The various aspects of the present disclosure will now be discussed in more detail with reference to FIGS. 1-8.

FIGS. 1-6 are diagrammatic fragmentary cross-sectional side views of a semiconductor device 50 at various stages of fabrication in accordance with various aspects of the present disclosure. The semiconductor device 50 is fabricated under a semiconductor technology node that is 5-nanometers or lower. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 1:
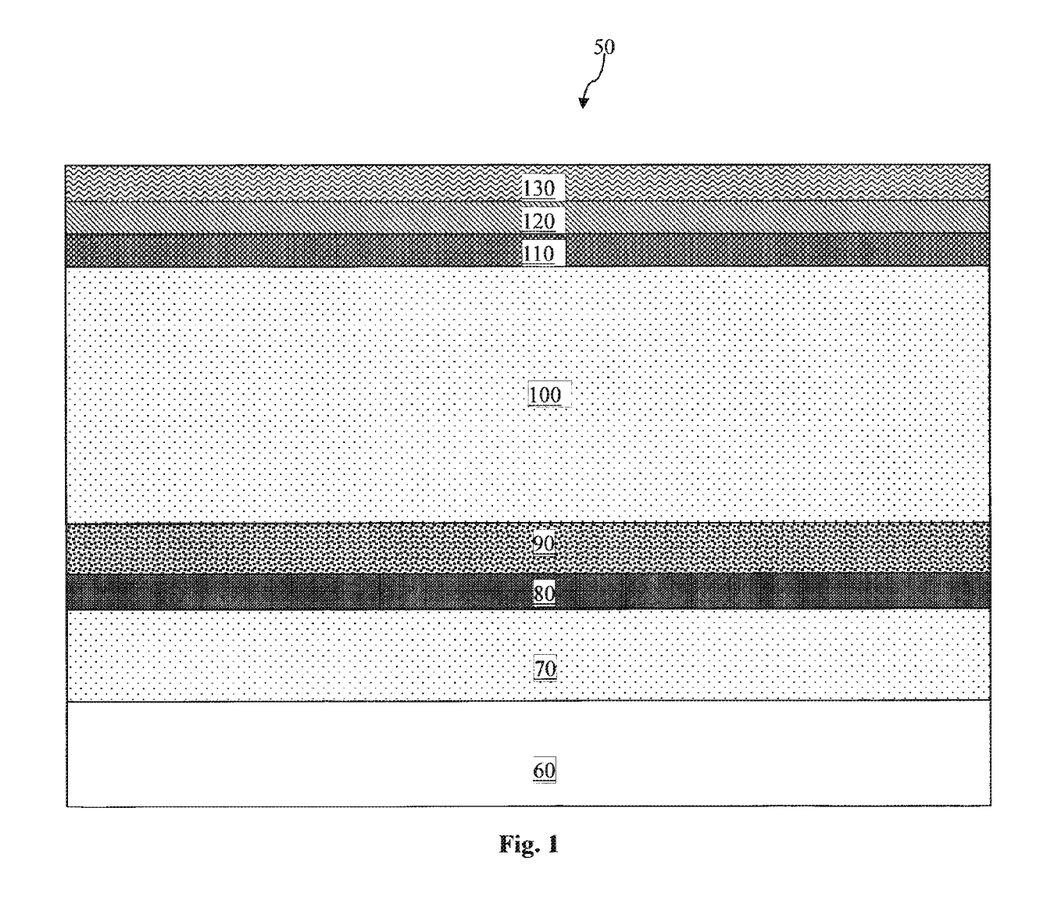
FIGS. 1-6 are diagrammatic cross-sectional side views of a semiconductor device at various stages of fabrication in accordance with some embodiments of the present disclosure.

The semiconductor device 50 includes a substrate 60. In some embodiments, the substrate 60 is a silicon substrate doped with a p-type dopant such as boron (for example a p-type substrate). Alternatively, the substrate 60 could be another suitable semiconductor material. For example, the substrate 60 may be a silicon substrate that is doped with an n-type dopant such as phosphorous or arsenic (an n-type substrate). The substrate 60 could include other elementary semiconductors such as germanium and diamond. The substrate 60 could optionally include a compound semiconductor and/or an alloy semiconductor. Further, the substrate 60 could include an epitaxial layer (epi layer), may be strained for performance enhancement, and may include a silicon-on-insulator (SOI) structure.

In some embodiments, the substrate 60 is substantially conductive or semi-conductive. The electrical resistance may be less than about $10^3$ ohm-meter. In some embodiments, the substrate 60 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 60 may contain Ti, Al, Co, Ru, TiN, WN2, or TaN.

In some other embodiments, the substrate 60 contains a dielectric material with a dielectric constant in a range from about 1 to about 40. In some other embodiments, the substrate 60 contains Si, metal oxide, or metal nitride, where the formula is MXb, wherein M is a metal or Si, and X is N or O, and wherein "b" is in a range from about 0.4 to 2.5. For example, the substrate 60 may contain $SiO_2$, silicon nitride, aluminum oxide, hafnium oxide, or lanthanum oxide.

It is understood that a plurality of drains/sources may be formed in the substrate 60, and a plurality of gates may be formed over the substrate 60. For reasons of simplicity, however, these drains/sources or gates are not specifically illustrated herein.

A dielectric layer 70 is formed over the substrate 60. The dielectric layer 70 may be formed using a deposition process. In various embodiments, the dielectric layer 90 may contain a low-k dielectric material. A low-k dielectric material may refer to a dielectric material having a dielectric constant lower than the dielectric constant of silicon dioxide, which is about 3.9. As non-limiting examples, the low-k dielectric material may include fluorine-doped silicon dioxide, carbon-doped silicon dioxide, porous silicon dioxide, porous carbon-doped silicon dioxide, spin-on organic polymeric dielectric materials, or spin-on silicon based polymeric dielectric materials.

An etching-stop layer 80 is formed over the dielectric layer 70. Thereafter, a Tetraethyl orthosilicate (TEOS) layer 90 is formed over the etching-stop layer 80. Another dielectric layer 100 is then formed over the etching-stop layer 80. The dielectric layer 100 may contain a low-k dielectric material as well. In some embodiments, the dielectric layer 100 and the dielectric layer 70 may have similar material compositions or the same material compositions.

A layer 110 is formed over the dielectric layer 100. In some embodiments, the layer 110 is a TEOS layer or a nitrogen-free antireflective coating (NFARC) layer. A titanium nitride (TiN) layer 120 is formed over the layer 110. A NFARC layer 130 is then formed over the TiN layer 120.

It is understood that the various layers 70-130 formed herein are merely examples and are not meant to be limiting. In other embodiments, one or more of the layers 70-130 may be omitted or substituted with a different material, or one or more additional layers may be added to the structure discussed above with reference to FIG. 1.

Figure 2:
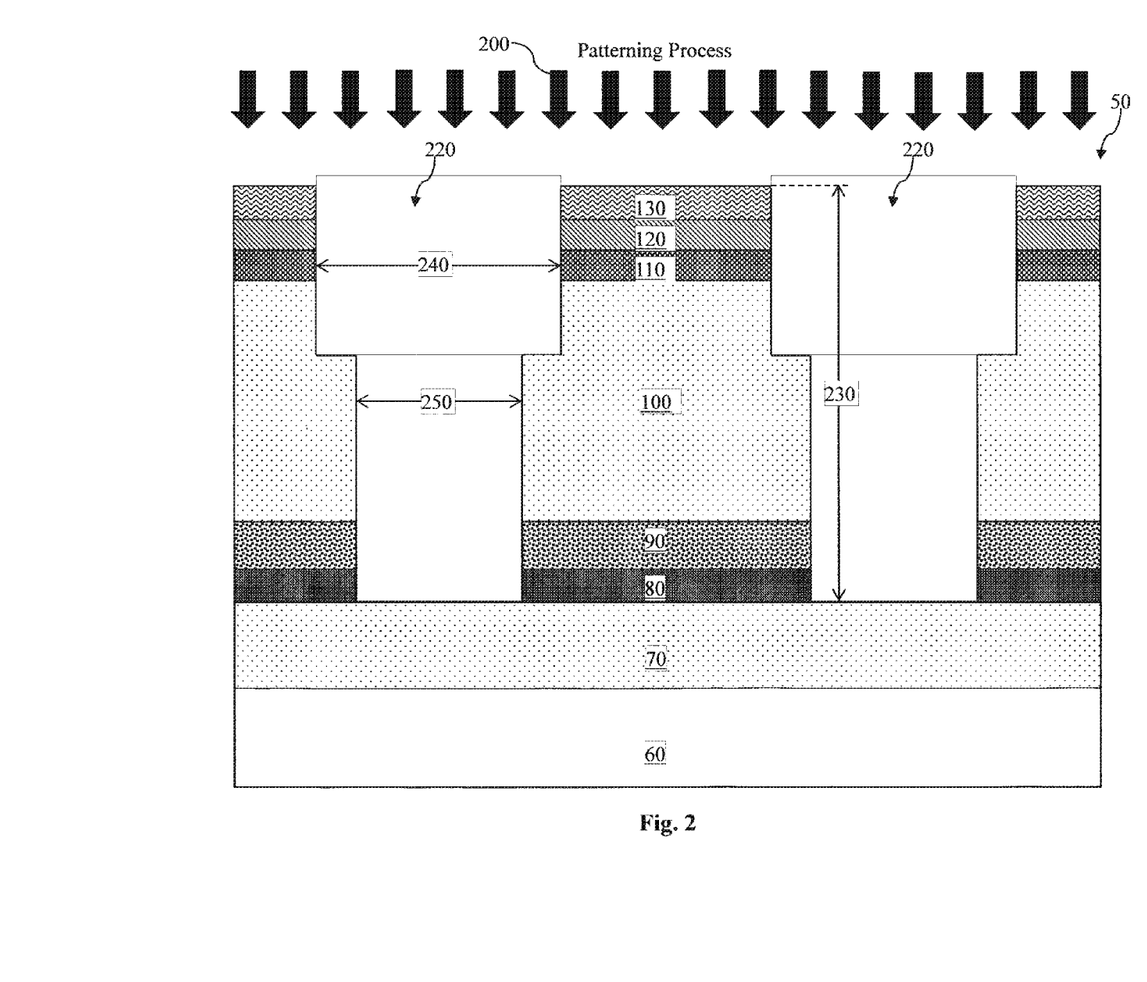

Referring now to FIG. 2, a patterning process 200 is performed to the semiconductor device 50 to form openings (or trenches) 220. The patterning process 200 to form the openings 220 may include one or more etching processes. The openings 220 are formed to each have a vertical dimension 230 (e.g., depth measured from the top of the opening 220 to an upper surface of the dielectric layer 70). The openings 220 are also formed to include two portions or segments with different lateral dimensions (e.g., widths). As shown in FIG. 2, each opening 220 includes a wider upper portion and a narrower lower portion. The wider upper portion has a lateral dimension 240, and the narrower lower portion has a lateral dimension 250. As discussed above, the semiconductor device 50 herein is fabricated under a 5-nanometer semiconductor technology node (or lower). As such, the dimensions 230, 240, and 250 are small. For example, in some embodiments, the vertical dimension 230 is in a range from about 500 angstroms to about 1200 angstroms, the lateral dimension 240 is in a range from about 100 angstroms to about 350 angstroms, and the lateral dimension 250 is in a range from about 80 angstroms to about 330 angstroms.

Figure 3:
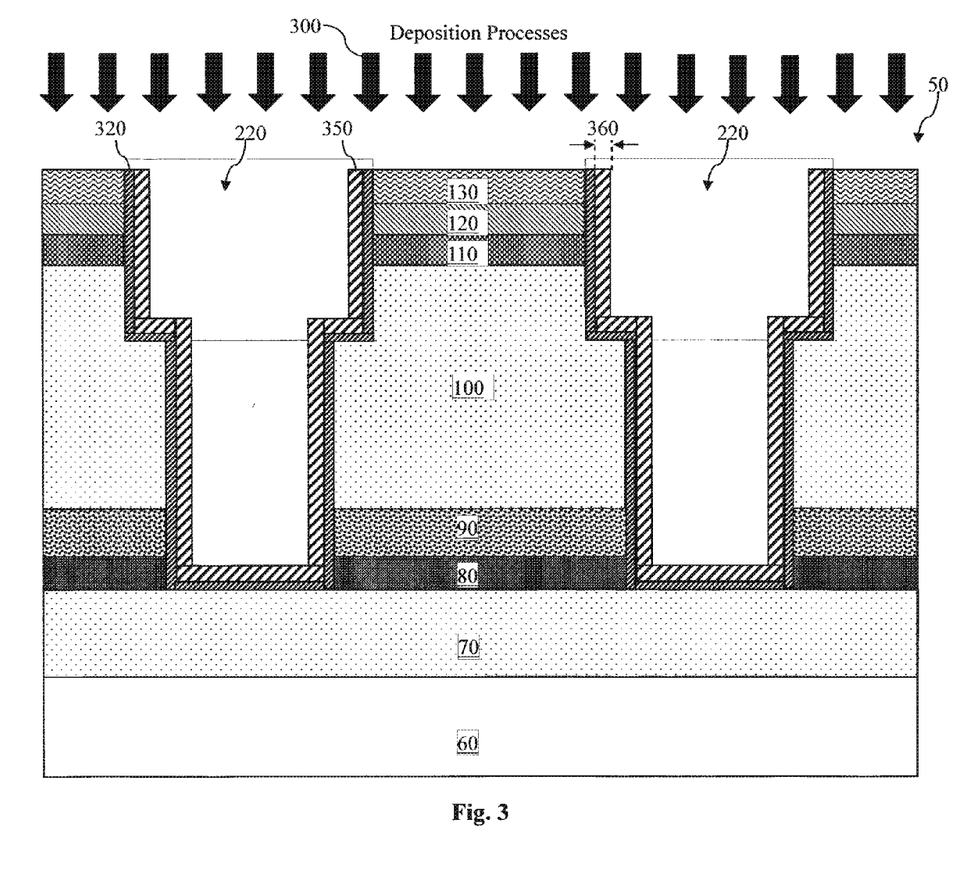

Referring now to FIG. 3, a plurality of deposition processes 300 are performed to form a barrier layer 320 and a liner layer 350. The barrier layer 320 is formed on surfaces of the various layers exposed by the openings 220. The barrier layer 320 may be formed by a physical vapor deposition (PVD) process, a chemical vapor deposition (CVD) process, or an atomic layer deposition (ALD) process. In some embodiments, the barrier layer 320 contains titanium nitride (TiN), tantalum nitride (TaN), or another suitable material. Among other things, the barrier layer 320 may serve the purpose of preventing metal diffusion.

The liner layer 350 is formed on the barrier layer 320. The liner layer 350 may be formed by a physical vapor deposition (PVD) process, a chemical vapor deposition (CVD) process, or an atomic layer deposition (ALD) process. The liner layer 350 and the barrier layer 320 have different material compositions. The material composition of the liner layer 350 is configured so that it will serve as a catalyst in a chemical reaction to remove impurities such as ligand in a subsequent deposition process to fill the openings 220. In some embodiments, the liner layer 350 contains rhodium (Rh). In some other embodiments, the liner layer 350 contains copper (Cu). In yet other embodiments, the liner layer 350 contains cobalt (Co). In further embodiments, the liner layer 350 contains nickel (Ni). In some embodiments, the liner layer is substantially made of Rh, or Cu, or Co, or Ni, and contains substantially no other materials but the Rh, or Cu, or Co.

The liner layer 350 also has a thickness 360. The thickness 360 may be configured to be in a range that is sufficiently thick to adequately serve as the catalyst to remove the impurities in the subsequent deposition process, while also thin enough so that it does not obstruct the filling of the openings 220 or otherwise interrupt the fabrication process flow. In some embodiments, the thickness 360 of the liner layer 350 is in a range from about 10 angstroms to about 150 angstroms.

Figure 4:
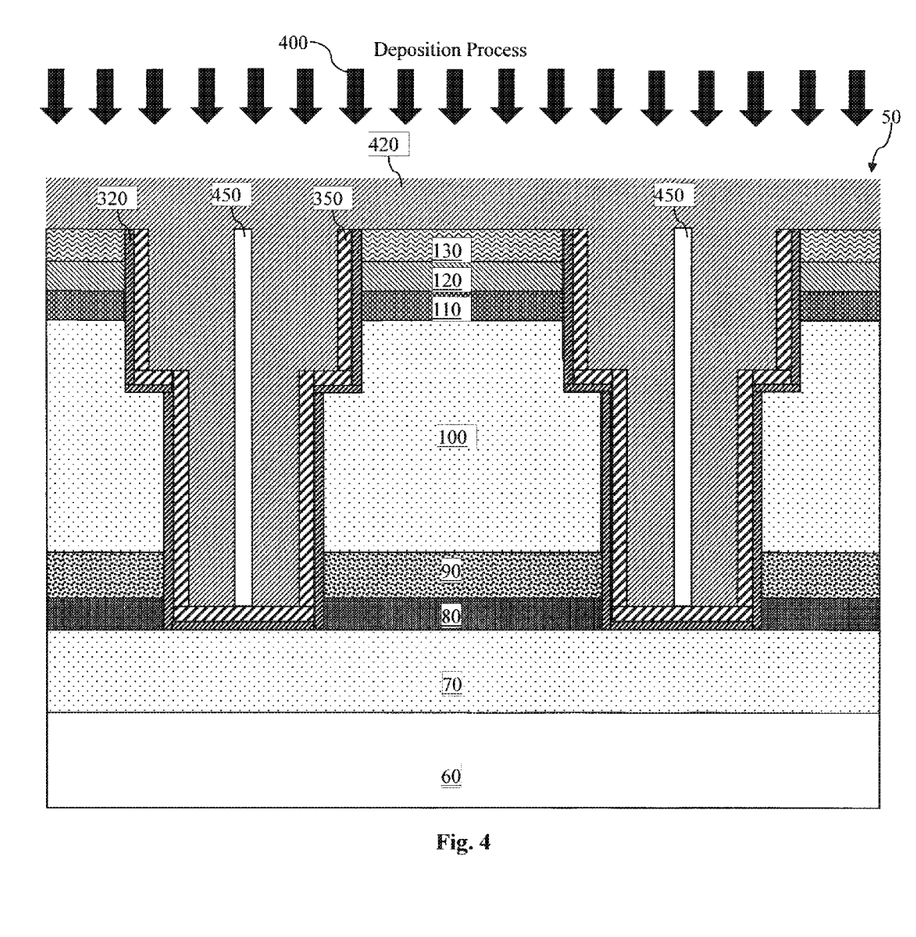
Figure 7A:
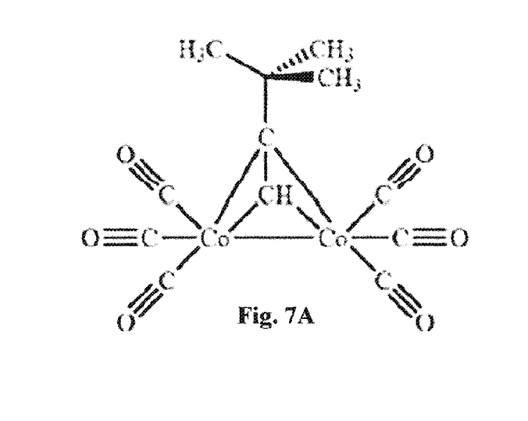
FIGS. 7A-7B illustrate chemical formulas and chemical reactions for removing impurities in accordance with some embodiments of the present disclosure.

Referring now to FIG. 4, a deposition process 400 is performed to fill the openings 220 with a non-copper conductive material 420. The conductive material 420 is cobalt, and the conductive material 420 may be interchangeably referred to as a cobalt material 420 hereinafter. The deposition process 400 may include a chemical vapor deposition (CVD) process in some embodiments. FIG. 7A illustrates the chemical formula for an example precursor material (dicobalt hexacarbonyl t-butyl acetylene[Co2(CO)6:(HC CtBu), CCTBA]) for the CVD process to form the cobalt material 420. In other embodiments, the cobalt precursors include, but are not limited to, Co2(CO)6:(HC CtBu), Co(MeCp)2 (wherein Cp represents a cyclopentadienyl group), Co(CO)3(NO), Co(CO)2Cp, CoCp2, Co2(CO)6: (HC CPh), Co2(CO)6:(HC CH), Co2(CO)6:(HC CCH3) and Co2(CO)6:(CH3C CCH3).

In other embodiments, the deposition process 400 may include an electrochemical plating (ECP) process, rather than a CVD process, to form the cobalt material 420.

Referring back to FIG. 4, whereas copper (Cu) has typically been the material of choice in conventional trench-filling processes, it is not an optimal candidate for the small technology node (5-nanometer or below) used to fabricate the semiconductor device 50 herein. As discussed above, using copper to fill the openings 220 may lead to various gap-filling issues. Also, the sheet resistance (Rs) for copper may be too high in such a small technology node. Therefore, according to the various aspects of the present disclosure, cobalt has replaced copper as the material for filling the openings 220. Cobalt has good trench filling performance, and one advantage of using cobalt over copper for the 5-nanometer technology node (or below) is that the sheet resistance Rs for cobalt is lower than the sheet resistance Rs of copper at the 5-nanometer technology node (or smaller). The smaller sheet resistance Rs offered by cobalt improves the device performance of the semiconductor device 50.

However, the deposition process 400 used to form cobalt as the conductive material 420 in the openings 220 may lead to impurities such as ligand materials. For example, had the cobalt material 420 been formed directly on the barrier layer 320, impurities may form inside the cobalt material 420. As a result, these impurities will lead to a lower quality cobalt filling the openings 220, for example a cobalt material 420 with voids or gaps that cannot be eliminated.

Therefore, the present disclosure forms the liner layer 350 on the barrier layer 320 first, and the cobalt material 420 is subsequently formed on the liner layer 350. As discussed above, the material composition of the liner layer 350 is configured such that it will serve as a catalyst in a chemical reaction with the impurities (e.g., ligand) of the cobalt material 420. This chemical reaction is shown in FIG. 7B (and also reproduced below) according to an embodiment of the present disclosure, referred to as hydroformylation (Oxo) Catalysis.

Figure 7B:
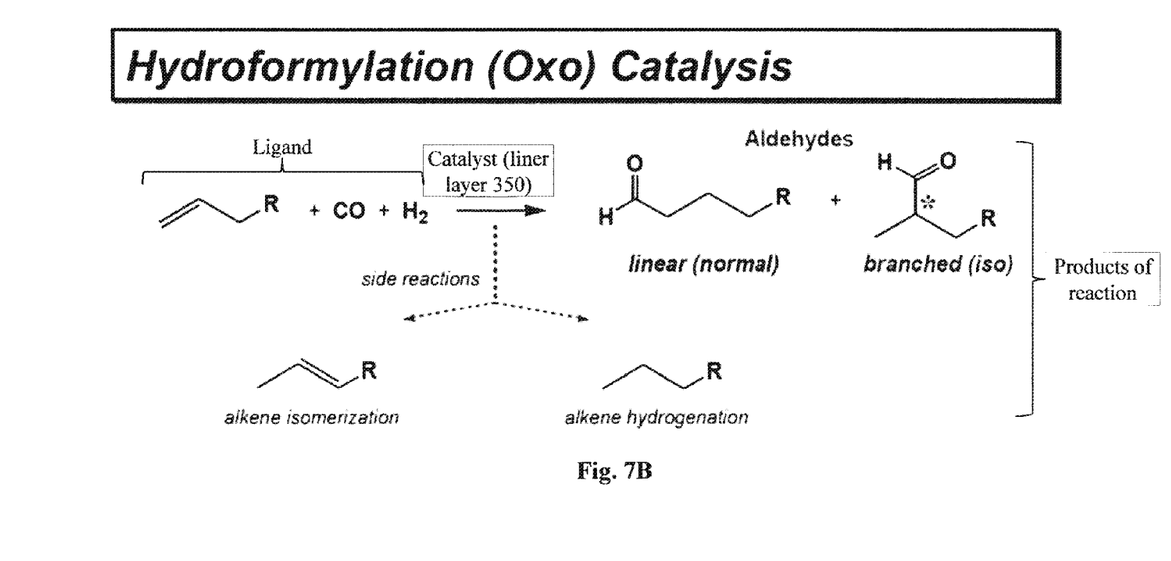

As is shown in FIG. 7B, the chemical formulas for the ligand material are on the left side of the catalyst (liner layer 350, which may contain Rh or Co, or even Cu or Ni), and the products of the reaction are shown on the right side of the catalyst. As a result of the chemical reaction, the ligand impurities are transformed into gaseous products (e.g., aldehydes), which can then be removed from the semiconductor device 50. For example, the gaseous products may be removed by a vacuum pump or pressure pump or by another suitable fabrication tool. In this manner, the cobalt material 420 filling the openings 220 has improved quality (e.g., substantially free of impurities such as ligands). This allows the gaps or voids in the cobalt material 420 to be removed later.

Referring back to FIG. 4, note that voids or gaps 450 may exist in the cobalt material 420 filling the openings 220. The voids or gaps 450 need not necessarily have a straight rectangular shape as shown in FIG. 4. The voids or gaps 450 may be a result of the deposition process 400 being a conformal deposition process, or they may be a result of other process imperfections. Regardless, these voids or gaps 450 will be removed in the subsequent process discussed below.

Figure 5:
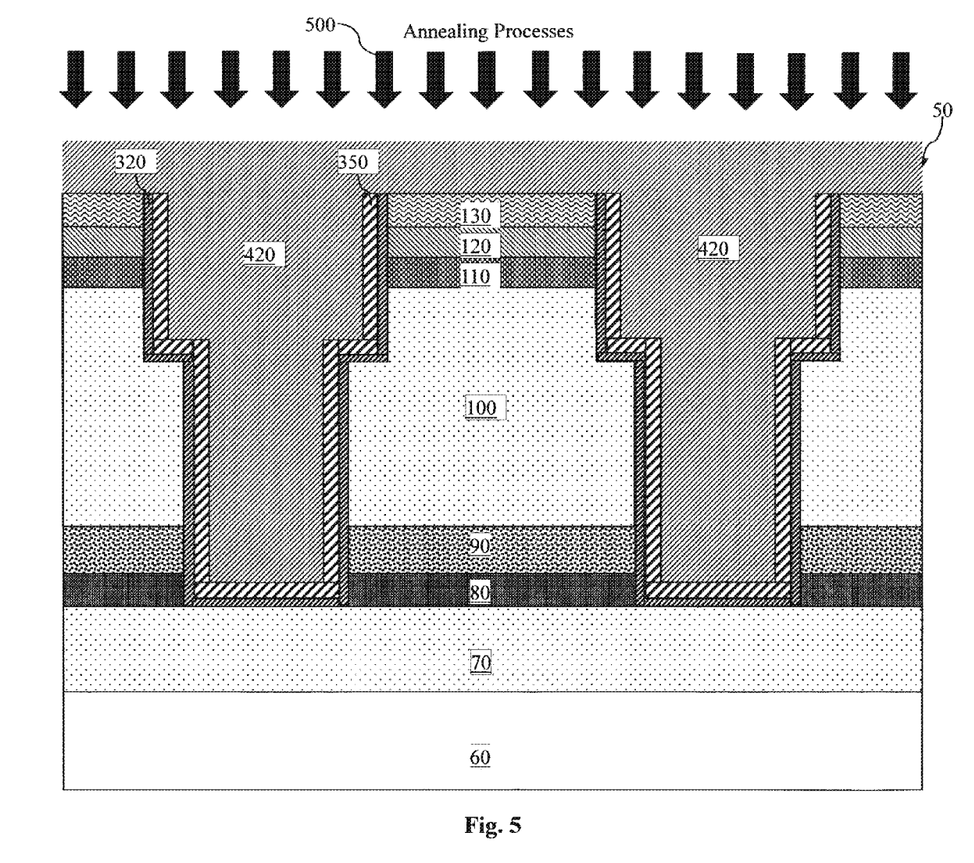

Referring now to FIG. 5, an annealing process 500 is performed to anneal the semiconductor device 50. In some embodiments, the annealing process 500 has a process temperature in a range from about 200 degrees to about 500 degrees, and a process duration from about 30 seconds to about 12000 seconds. As a result of the annealing process, the voids or gaps 450 (shown in FIG. 4) inside the cobalt material 420 are eliminated.

Figure 6:
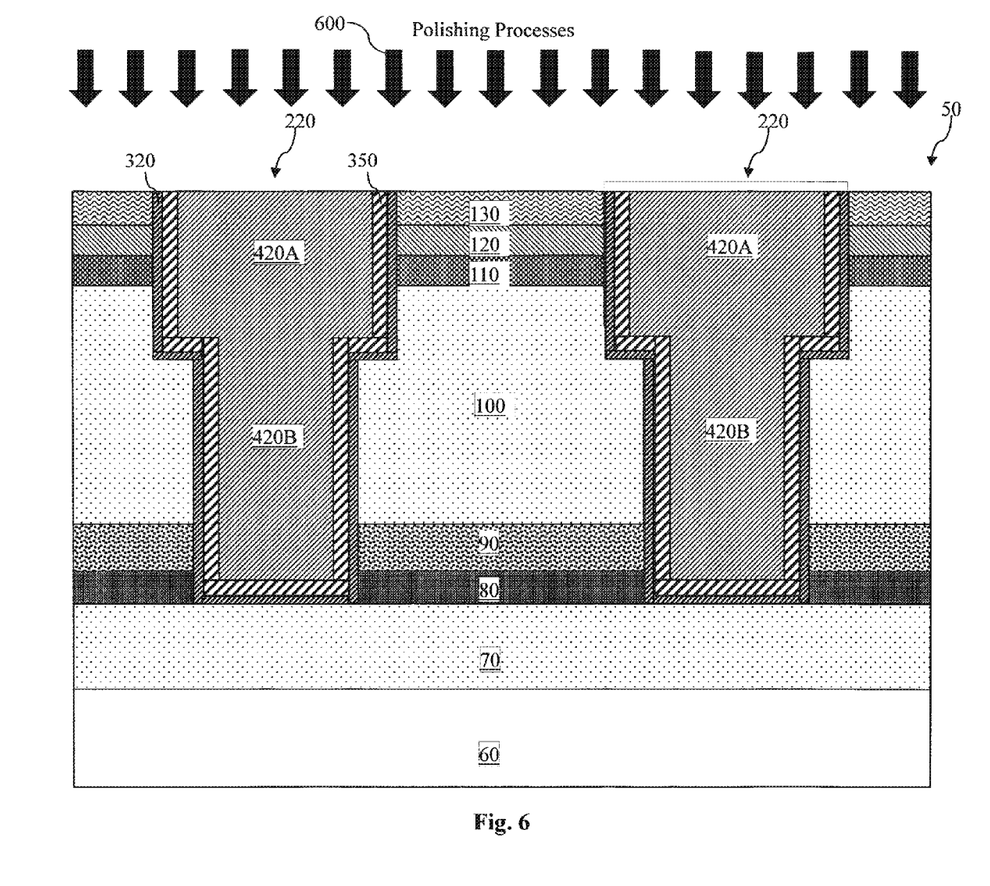

Referring now to FIG. 6, a polishing process 600 is performed to the semiconductor device 50. The polishing process 600 may include a chemical-mechanical-polishing (CMP) process in some embodiments. As a result of the polishing process 600, excess portions of the cobalt material 420 outside the openings 220 are removed. In other words, the cobalt material 420 filling the openings 220 will have upper surfaces that are substantially co-planar with the upper surfaces of the layer 130.

At this point, metal lines (of a multilayer interconnect structure) are formed by segments 420A of the cobalt material disposed in the wider upper portions of the openings 220, while vias (of the multilayer interconnect structure) are formed by segments 420B of the cobalt material disposed in the narrower lower portions of the openings 220. Since these cobalt metal lines 420A and vias 420B are formed on the liner material 350, rather than directly on the barrier layer 320, the impurities in the cobalt are removed via chemical reactions where the material of the liner layer 350 serves as the catalyst.

Figure 8:
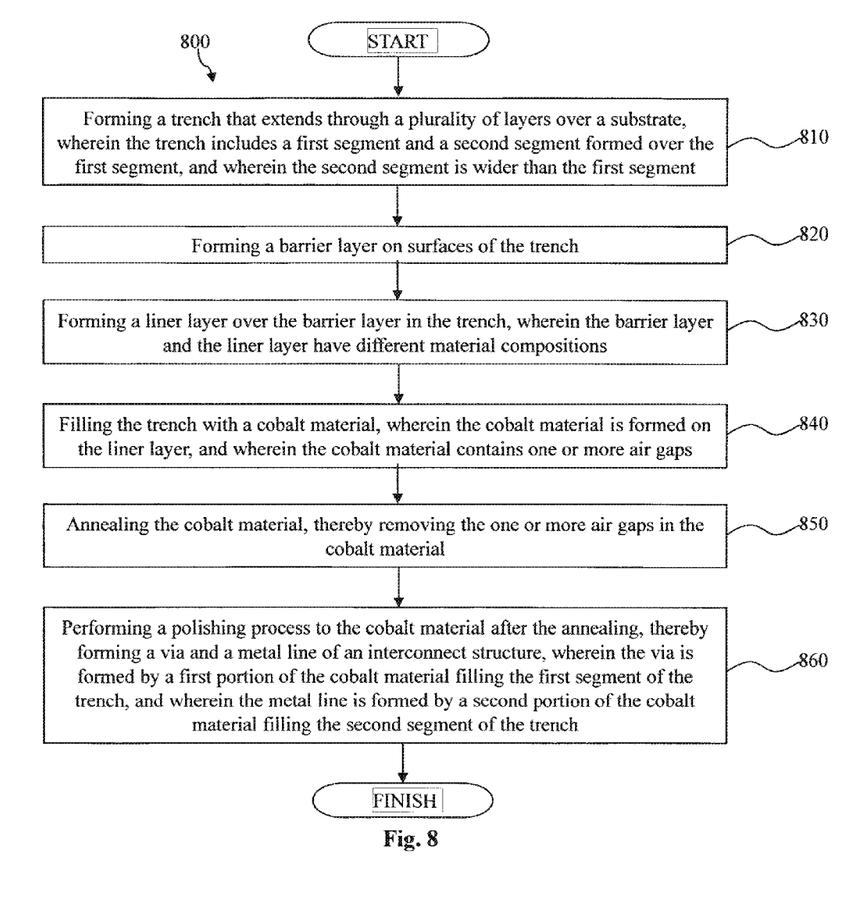
FIG. 8 is a flowchart illustrating a method of fabricating a semiconductor device in accordance with some embodiments of the present disclosure.

FIG. 8 is a flowchart of a method 800 of fabricating a semiconductor device according to various aspects of the present disclosure. One or more of the steps of the method 800 are performed as a part of a fabrication process for a semiconductor technology node that is a 5-nanometer technology node or smaller.

The method 800 includes a step 810 of forming a trench that extends through a plurality of layers over a substrate. The trench includes a first segment and a second segment formed over the first segment. The second segment is wider than the first segment.

The method 800 includes a step 820 of forming a barrier layer on surfaces of the trench.

The method 800 includes a step 830 of forming a liner layer over the barrier layer in the trench. The barrier layer and the liner layer have different material compositions. In some embodiments, the forming of the liner layer comprises forming one of the following: a rhodium liner layer, a cobalt liner layer, a copper liner layer, or a nickel layer.

The method 800 includes a step 840 of filling the trench with a cobalt material. The cobalt material is formed on the liner layer. The cobalt material contains one or more air gaps.

The method 800 includes a step 850 of annealing the cobalt material, thereby removing the one or more air gaps in the cobalt material.

The method 800 includes a step 860 of performing a polishing process to the cobalt material after the annealing, thereby forming a via and a metal line of an interconnect structure. The via is formed by a first portion of the cobalt material filling the first segment of the trench. The metal line is formed by a second portion of the cobalt material filling the second segment of the trench.

In some embodiments, the forming of the liner layer comprises configuring a material composition of the liner layer such that, when the cobalt material is in physical contact with the liner layer, impurities from the cobalt metal material are removed via a chemical process in which the liner layer serves as a catalyst.

It is understood that additional processes may be performed before, during, or after the steps 810-860 of the method 800 to complete the fabrication of the semiconductor device. For example, the method 800 may include dicing, packaging, or testing processes. For reasons of simplicity, additional fabrication steps are not discussed herein in detail.

Based on the above discussions, it can be seen that the present disclosure offers advantages over conventional methods and devices of low-k dielectric material fabrication. It is understood, however, that other embodiments may offer additional advantages, and not all advantages are necessarily disclosed herein, and that no particular advantage is required for all embodiments. One advantage is that trench filling issues can be improved for a semiconductor fabrication technology node such as the 5-nanometer technology node or smaller. For older technology nodes (e.g., greater than the 5-nanometer node), conventional trench filling techniques using copper may be sufficient. However, as device sizes become smaller with each technology generation, copper-filled trenches may have gap filling issues for newer technology nodes such as the 5-nanometer technology node or below. In addition, the sheet resistance Rs for copper may be too high for the 5-nanometer technology node.

To overcome the problems associated with copper filling, the present disclosure replaces copper with cobalt, which has a lower sheet resistance than copper for the 5-nanometer technology node or below, as well as decent gap filling performances. The trench liner is formed so that the cobalt material can be formed directly on the trench liner, rather than on a barrier material. The trench liner's material composition is selected so that it will serve as a catalyst to help remove the impurities (e.g., ligands) in the cobalt material. Without the impurities, voids or gaps in the cobalt material can be eliminated in a subsequent annealing process. Consequently, the electrical interconnect elements (e.g., metal lines and vias) formed with the cobalt material can be formed to be substantially free of impurities and voids/gaps. Device performance is therefore enhanced. Another advantage is that the cobalt interconnection elements have better electro-migration performance than copper interconnect elements. Yet another advantage is that the present disclosure does not require many changes to the existing method of fabrication. As such, it does not significantly increase fabrication cost, if at all.

One aspect of the present disclosure pertains to a method of fabricating a semiconductor device. An opening is formed that extends through a plurality of layers over a substrate. A barrier layer is formed on surfaces of the opening. A liner layer is formed over the barrier layer in the opening. The barrier layer and the liner layer have different material compositions. The opening is filled with a non-copper metal material. The non-copper material is formed over the liner layer.

Another aspect of the present disclosure pertains to a method of fabricating a semiconductor device. A trench is formed that extends through a plurality of layers over a substrate. The trench includes a first segment and a second segment formed over the first segment. The second segment is wider than the first segment. A barrier layer is formed on surfaces of the trench. A liner layer is formed over the barrier layer in the trench. The barrier layer and the liner layer have different material compositions. The trench is filled with a cobalt material. The cobalt material is formed on the liner layer. The cobalt material contains one or more air gaps. The cobalt material is annealed, thereby removing the one or more air gaps in the cobalt material. A polishing process is performed to the cobalt material after the annealing, thereby forming a via and a metal line of an interconnect structure. The via is formed by a first portion of the cobalt material filling the first segment of the trench. The metal line is formed by a second portion of the cobalt material filling the second segment of the trench.

Yet another aspect of the present disclosure pertains to a semiconductor device. The semiconductor device includes a substrate. A plurality of layers is disposed over the substrate. An opening is disposed in the plurality of layers. A barrier layer is disposed on surfaces of the opening. A liner layer is disposed on the barrier layer. The barrier layer and the liner layer have different material compositions. A non-copper metal material is disposed on the barrier layer and filling the opening. The non-copper metal material is substantially free of impurities and air gaps.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming an opening that extends through a plurality of layers over a substrate;
   forming a liner layer in the opening; and
   depositing a metal material in the opening, wherein the metal material contains an impurity, and wherein the impurity is transformed into a gaseous product through a chemical reaction in which the liner layer serves as a catalyst.

2. The method of claim 1, wherein the depositing comprises depositing a metal material that is free of copper.

3. The method of claim 2, wherein the depositing comprises depositing cobalt or rhodium as the metal material.

4. The method of claim 1, wherein the depositing comprises a chemical vapor deposition (CVD) process.

5. The method of claim 1, wherein the depositing comprises an electrochemical plating (ECP) process.

6. The method of claim 1, wherein the depositing is performed such that the metal material is in direct physical contact with the liner layer.

7. The method of claim 1, wherein the impurity includes a ligand material.

8. The method of claim 1, wherein the chemical reaction comprises a hydroformylation catalysis.

9. The method of claim 1, wherein the gaseous product includes aldehydes.

10. The method of claim 1, further comprising: removing the gaseous product via a vacuum pump.

11. The method of claim 1, wherein a void is left in the deposited metal material, and wherein the method further comprises: performing an annealing process to remove the void.

12. The method of claim 1, further comprising: forming a barrier layer in the opening before the forming of the liner layer, and wherein the liner layer is formed over the barrier layer.

13. A method of fabricating a semiconductor device, comprising:
   forming a trench that extends through one or more layers that are formed over a substrate;
   forming a barrier layer in the trench;
   forming a liner layer over the barrier layer; and
   depositing a non-copper metal material on the liner layer, wherein the non-copper metal material contains a ligand impurity, and wherein the ligand impurity is transformed into a removable product at least in part through a hydroformylation catalysis process in which the liner layer serves as a catalyst.

14. The method of claim 13, wherein the depositing comprises depositing cobalt or rhodium as the non-copper metal material.

15. The method of claim 13, wherein the depositing comprises a chemical vapor deposition (CVD) process.

16. The method of claim 13, wherein the depositing comprises an electrochemical plating (ECP) process.

17. The method of claim 13, wherein the removable product has a gaseous form.

18. The method of claim 13, further comprising:
   removing the removable product; and
   performing an annealing process to remove any voids or gaps in the deposited non-copper metal material.

19. A method of fabricating a semiconductor device, comprising:
   forming a trench that extends through one or more layers that are formed over a substrate;
   forming a barrier layer in the trench;
   forming a liner layer over the barrier layer;
   depositing a non-copper metal material on the liner layer, wherein the non-copper metal material contains a ligand impurity, and wherein the ligand impurity is transformed into an aldehyde-containing material through a chemical reaction in which the liner layer serves as a catalyst; and
   removing the aldehyde-containing material.

20. The method of claim 19, wherein the depositing comprises depositing cobalt or rhodium as the non-copper metal material.

* * * * *